United States Patent [19]
Chen

[11] Patent Number: 5,723,387
[45] Date of Patent: Mar. 3, 1998

[54] METHOD AND APPARATUS FOR FORMING VERY SMALL SCALE CU INTERCONNECT METALLURGY ON SEMICONDUCTOR SUBSTRATES

[75] Inventor: Lai-Juh Chen, Hsin-Chu, Taiwan

[73] Assignee: Industrial Technology Research Institute, Hsin-Chu, Taiwan

[21] Appl. No.: 684,714

[22] Filed: Jul. 22, 1996

[51] Int. Cl.$^6$ ................................................. H01L 21/00
[52] U.S. Cl. ..................... 438/692; 156/345; 216/18; 216/38; 216/39; 438/697
[58] Field of Search ................ 156/345 LP, 345 PC, 156/345 MC; 438/692, 697, 700, 706; 216/18, 37, 38, 39, 41, 91, 67; 204/298.35

[56] References Cited

U.S. PATENT DOCUMENTS

| 5,110,394 | 5/1992 | Ogawa | 156/345 PC |
| 5,372,647 | 12/1994 | Ohmi | 156/345 PC |
| 5,380,682 | 1/1995 | Edwards et al. | 437/225 |

OTHER PUBLICATIONS

"Dual Damascene Copper Metallization Process Using Chemical Mechanical Polishing" by S. Lakshiminarayanan.
"Selective and Blanket Electroless Cu Plating Initiated by Contact Filling", Dublin et al, Jun. 27–29, 1995, VMIC Conf. 1995 ISMIC pp.315–324.
"Electroless Copper Deposition on Metals & Metal Silicides", Cecilia Y. Mak, MRS Bulletin, Aug. 1994, pp. 55–62.

*Primary Examiner*—William Powell
*Attorney, Agent, or Firm*—George O. Saile; Stephen B. Ackerman; Wolmar J. Stoffel

[57] ABSTRACT

A self contained unit for forming Cu metallurgy interconnection structures on SC substrates. The unit has an enclosed chamber with a plurality of apparatus for performing wet processes, including electroless metal plating and planarization. The unit provides a way of reducing the number of times the wafer is transferred between the wet process steps that require less environmental cleanliness and dry very clean processes steps.

19 Claims, 7 Drawing Sheets

METHOD AND APPARATUS FOR FORMING VERY SMALL SCALE CU INTERCONNECT METALLURGY ON SEMICONDUCTOR SUBSTRATES

BACKGROUND OF THE INVENTION

1. Field of the Invention

The present invention relates to microminiaturized integrated circuit semiconductor devices, more specifically to manufacturing apparatus and methods for producing high density interconnect metallurgy for semiconductor devices.

2. Description of the Related Art

There continues to be a dramatic increase in the complexity of integrated circuits each year. As applications develop for memories, microprocessors, and minicomputers there is an increasing demand for greater microminiturization, greater switching speeds, and smaller and less costly integrated circuit semiconductor devices.

Increased device microminiturization improves device performance, packing density and reduces cost per unit. However, microminiturization reduces yield and reliability, and degrades interconnect performance and noise margins.

In order to continue microminiturization of semiconductor devices it appears that designers must resort to more metal layers for non-scaling Al lines, multi-level interconnections, and global planarization. Another alternative is to change the metallurgy to Cu and/or change to insulating materials having lower dielectrics.

The use of Cu in interconnection metallurgy systems has long been considered as an alternative metallization material to Al and Al alloys due to its low resistivity and ability to reliably carry high current densities. However, its use has presented many problems, such as the possibility of diffusion into the semiconductor substrate, the low adhesive strength of Cu to various insulating layers, and the difficulties inherent in masking and etching the blanket Cu layer into intricate circuit structures.

An article entitled "Dual Damascene Copper Metallization Process Using Chemical-Mechanical Polishing" by S. Lakshninarayanan et al, describes a process wherein a Cu metallurgy interconnection system is fabricated by depositing Cu in grooves in an oxide layer, using Cu sputter deposition technics. The excess Cu is then polished away using chemical/mechanical polishing leaving the Cu in the grooves. The described process contains numerous process steps that are performed in a dry very clean environment, and process steps performed in a wet or inherently "dirty" environment, such as polishing. Each time the wafer is transferred from the wet to a dry environment a time consuming and expensive cleaning and drying operation must be performed. The described process called a Damascene process involves many such dry to wet environment changes that increase costs and potentially reduce yield.

The diffusion of Cu into semiconductor materials can be prevented by using various barrier layers which can also act to increase the adhesion of Cu to various other dielectric materials. The defining of the metallurgy patterns by electroless plating technics has also been suggested in publications such as "Selective and Blanket Electroless Cu Plating Initiated By Contact Filling", Author—Dubin et al. in Jun. 27–29, 1995 VMIC Conference, 1995 ISMIC pages 315–324. Another publication which describes electroless Cu deposition in semiconductors is "Electroless Copper Deposition On Metals and Metal Silicides", Author—Cecilia Y. Mak, in MRS bulletin/August 1994, pages 55–62.

The use of electroless metal plating to form semiconductor (SC) metallurgy Interconnection structure involves combining the conventional dry SC fabrication technology with wet technology that is necessary in electroless and electrical metal plating. The two technologies have different and diverse requirements that make their combination in a semiconductor manufacturing line quite difficult and expensive. When changing from a dry technology to a wet technology process, such as electroplating, mechanical polishing etc., a very careful cleaning and drying step must be performed following the wet process. This process is time consuming and expensive and should be as limited as possible.

SUMMARY OF THE INVENTION

It is an object of the invention to provide a method of forming microminiturized Cu metallurgy on a SC substrate in which the number of times the processes are changed from wet to dry is as limited as possible.

It is an object of the invention to provide a new self-contained enclosure to house the manufacturing elements necessary to fabricate Cu metallurgy by combining electroless and electro plating technics with mechanical/chemical polishing, and associated processes.

It is another object of the invention to provide an enclosure and manufacturing elements for manufacturing Cu metallurgy by electroless and electroplating that can be incorporated into a conventional manufacturing line, where the remainder of the device is manufactured using dry very clean environments.

It is yet another object of the invention to provide a method and a manufacturing unit for utilizing Cu plating and planarization of the deposited layers, wherein the requirements for changing environments is reduced.

In accordance with the aforementioned objectives, an improved method of forming Cu interconnect metallurgy is presented. After the internal device structure of substrate is formed by conventional technics, a first dielectric layer is formed in the substrate surface. A resist mask is deposited, exposed and developed to define a level of interconnection metallurgy. Grooves are etched into the first layer and the mask removed. These steps are all done in a very clean dry environment which is necessitated by very small metallurgy size. After a barrier layer is deposited on the surface and in the grooves, a layer of Cu is plated on the surface, and the Cu layer polished to expose the barrier layer. The exposed barrier layer is then etched away and the Cu polished to planarize it with the substrate surface. A second barrier layer is selectively deposited on the Cu, using electroless plating technics. The substrate is then cleaned and dried, and a second dielectric layer applied. The aforementioned steps are repeated to form additional metallurgy layers.

Also, a self-contained unit for forming Cu metallurgy interconnection structures fox incorporation into SC manufacturing lines is presented. The unit of the invention has an enclosed chamber, input and output stations for introducing and withdrawing SC wafers to and from the chamber, a Cu plating apparatus, and a bath for electroless plating in the chamber, primary and secondary polishing apparatus in the chamber, automated indexer apparatus for moving the wafers between the apparatus within the chamber, and a means to automatically operate the apparatus within the chamber.

DESCRIPTION OF THE PREFERRED EMBODIMENTS

Figure 5:
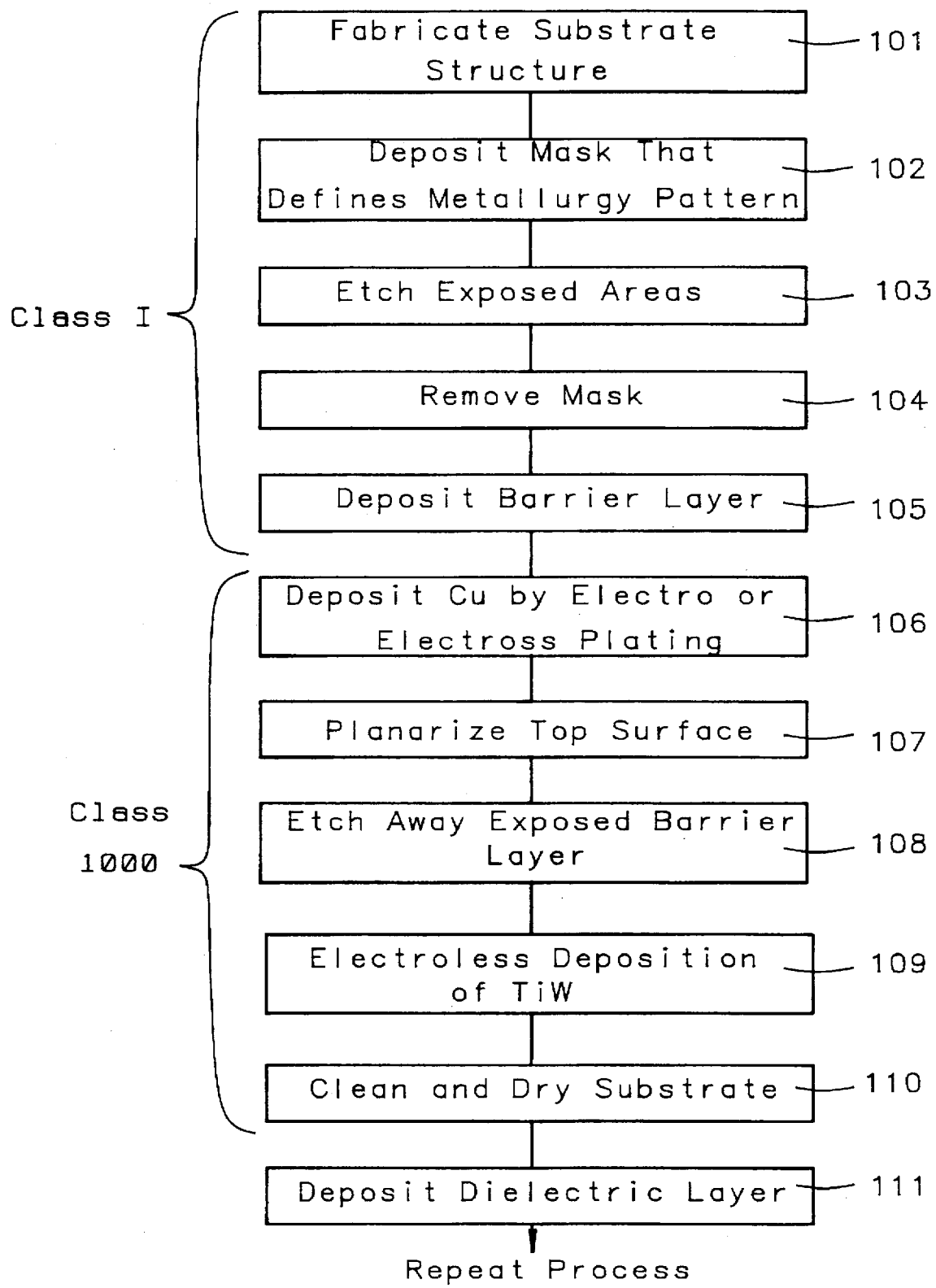
FIG. 5 is a block diagram that depicts the sequence of process steps of the invention.

Referring now to the Figs. of the drawings, there is depicted specific embodiments of the manufacturing unit of the invention for performing specific process steps on a semiconductor substrate. FIG. 5 depicts the steps of the process. Block 101 indicates that a dielectric layer is formed on the top surface of a semiconductor substrate containing internal device structure. This layer is formed in a very clean environment, typically a class 1000, by technics well known in the art. The substrate will have internal structure including various impurity regions recessed oxide isolation, transistors, resistors etc. that are well known in the art and are not part of this invention. Block 102 indicates that a resist layer is deposited on the substrate, exposed and developed to define the desired metallurgy pattern. Block 103 indicates that the exposed areas of the substrate are etched using known dry etching technics, such as plasma etching etc. The steps indicated by blocks 102 and 103 can be repeated to form via holes to the substrate or between metallurgy levels. Block 104 indicates that the resist mask has been removed. Block 105 indicates that a thin barrier layer, on the order of 100 nm, is deposited on the surface and in the depressions or grooves. The barrier layer is typically TiW, but could be any of several known barrier layers, which is also deposited in a very clean environment. Block 106 indicates that a relatively thick Cu layer, on the order of 2 um, is deposited on the surface of the substrate and into the grooves, or depressions. The thickness is great enough to file the grooves to a level above the surface of the substrate. The Cu layer alternatively can be deposited by electroless plating technics, which are well known. When electroless plating is used the barrier layer must be activated with Pd, Pt, or other activating agents, as is known. Block 107 indicates that the Cu layer is planarized by mechanical polishing down to the barrier layer. Block 108 indicates that the exposed portions of the first barrier layer are etched away using a wet etchant. Block 109 indicates that a second barrier layer is selectively deposited on the top surface of the Cu lines, using electroless plating. Blocks 106 through 109 are all wet process steps that are done in a less stringent environment, typically class 1000. Block 110 indicates that the substrate is cleaned and dried in preparation for re-introduction into the very clean environment. Block 111 indicates a second dielectric layer is deposited on the substrate and the aforedescribed process sequence of steps is repeated to form another metallurgy layer.

FIGS. 4a–4e depict a semiconductor substrate at various stages of the process performed by the method and manufacturing unit of the invention. The unit is self contained and designed to perform several process steps for depositing and shaping Cu interconnect metallurgy on a semiconductor device. Typically, the device has been fabricated in a conventional process line to form the various dielectric isolation, regions, and provide the ion implantation steps necessary to produce a device substrate that is ready for receiving the interconnection metallurgy system. In the conventional manufacturing line this processing is performed in a very clean dry environment, typically a clean room class 1. This environment is difficult to establish and to maintain, but is necessary to fabricate the modern very microminiaturized device structure. In applicant's manufacturing unit, a series of manufacturing steps capable of fabricating interconnection metallurgy are grouped and performed in a self-contained enclosure where the environment is less stringent, typically in a clean room class 1000. The number of times the environment is changed during fabrication of the interconnection metallurgy system is drastically reduced. This reduces the cost of fabrication, the time required to produce the device, and increases the yield of the product. In applicant's process the substrate is removed after the first barrier layer, block 105, and the processing from block 106 to 109 done in a wet less stringent environment. In the prior art technology, the same processing would have required several environment changes.

Figure 4A:
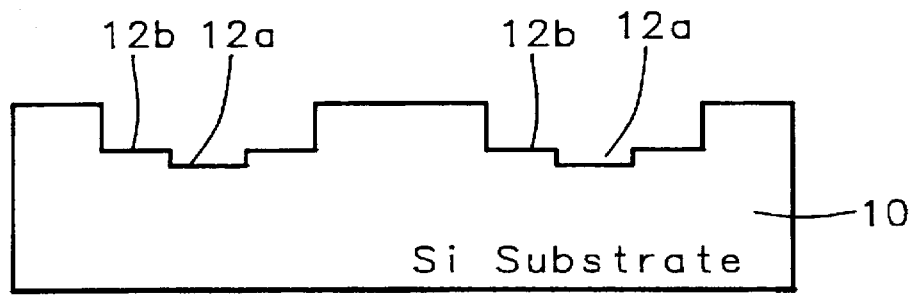
FIGS. 4a–4e is a sequence of cross sectional views that illustrate the nature of the operations to be performed in the manufacturing unit of the invention.
Figure 4B:
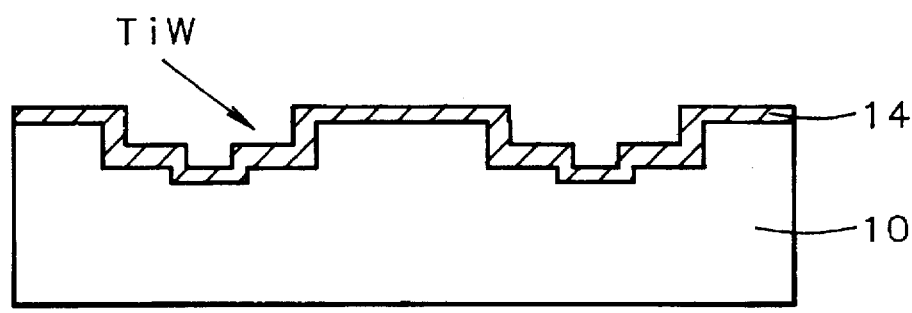

Referring now to FIGS. 4a–4e, a preferred process is depicted by a series of sequential cross sectional views that show the interconnect structure at various stages. In FIG. 4a, a substrate 10 is shown provided with depressions 12 that define the shape of an interconnect structure. The substrate 10 will have conventional integrated circuit structure embodied therein, such as isolation structure, P/N junctions and doped regions that form memory cells, switching circuits etc. The lower level depressions 12a can define via holes through a dielectric layer that serve as contact areas to various device regions and/or via interconnection circuit structure The depressions 12b, formed in a dielectric layer 11 on the substrate, define the interconnection metallurgy configuration. The depressions, 12a and b, are formed in the substrate prior to its entering the unit by conventional fabrication technics in a very clean environment. In FIG. 4b there is shown a barrier or adhesion layer 14, preferably of TiW, which is deposited by CVD or plasma deposition.

Figure 4C:
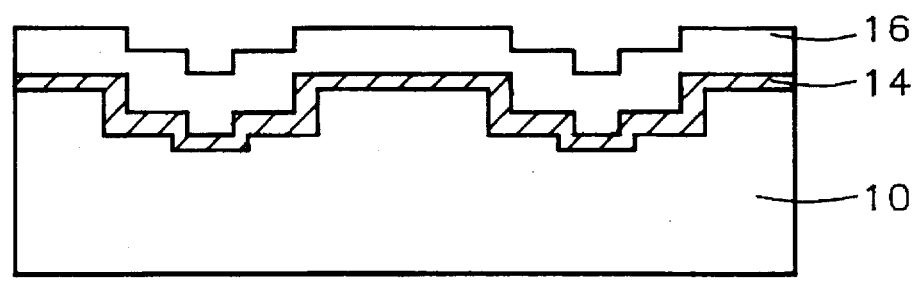
Figure 4D:
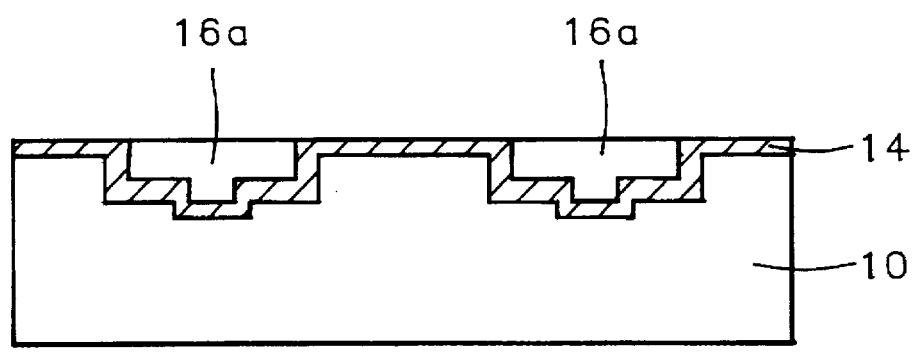

As shown in FIG. 4c, a thick layer of Cu is deposited over layer 14 using electroplating or electroless plating technics. The thickness of layer 16 is adjusted to completely fill the grooves. This process is done in a wet environment. As shown in FIG. 4D, the surface of the substrate is planarized by removing the material of layer 16 down to the surface of layer 14 thereby leaving portions 16a in the depressions.

Figure 4E:
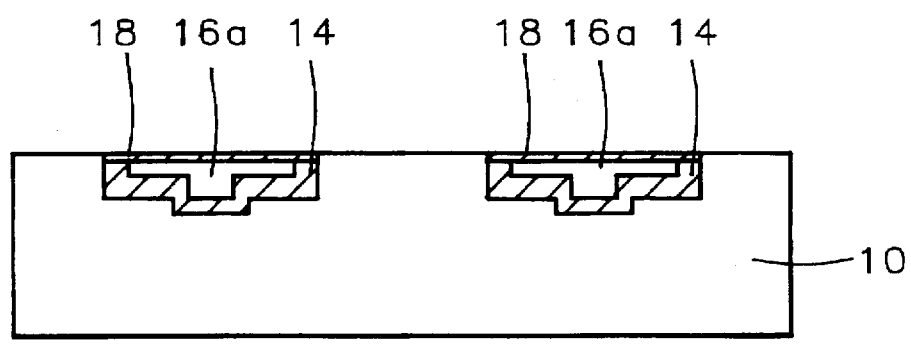

As indicated in FIG. 4E, the exposed portions of barrier layer 14 are selectively removed by a wet etch. The surface of the substrate can be planarized by polishing to remove the protruding Cu portions, and a second thin barrier layer 18 selectively deposited on the Cu pattern surface. A second dielectric layer 19 can be deposited over the first dielectric layer in a very clean environment. The process can be repeated to form another overlying metallurgy layer.

Figure 3:
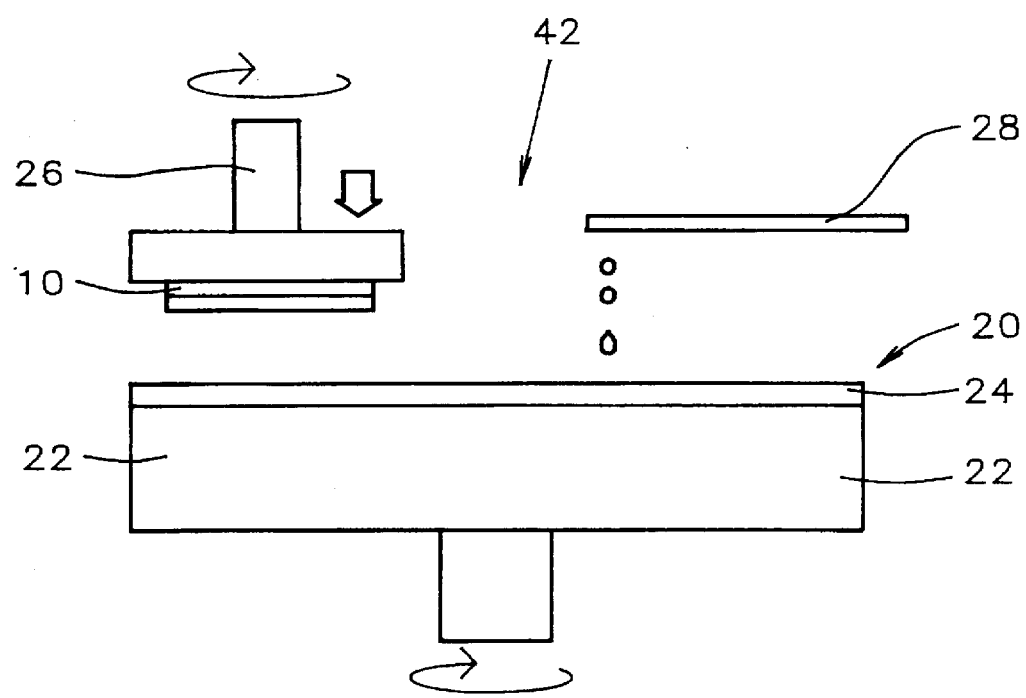
FIG. 3 is an elevational view of a mechanical polishing apparatus suitable for use in the manufacturing unit of the invention.

The planarization of layer 16 is accomplished in an apparatus 20, shown in FIG. 3. Polishing apparatus 20 has a rotatable table 22 having a polishing pad 24 mounted on the top surface. A rotatable wafer carrier 26 is mounted over table 22 with substrate 10 mounted on the lower surface in contact with pad 24. A suitable structure 28 dispenses slurry on the rotating pad 24.

Figure 1:
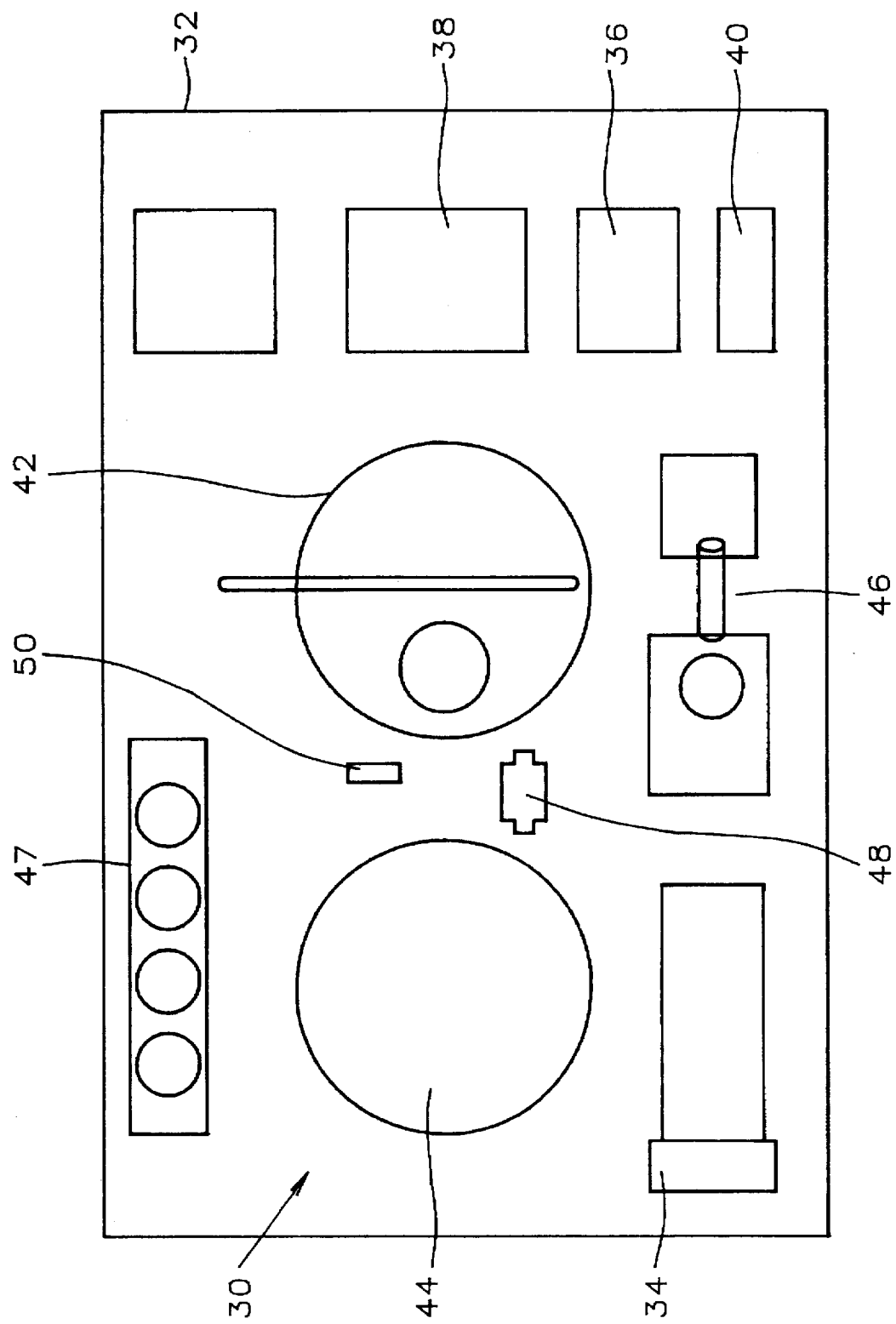
FIG. 1 is a schematic view of the manufacturing unit of the invention.

Referring now to FIG. 1, there is schematically depicted the general structure of the manufacturing unit of the invention. The unit 30 has an chamber 32 for enclosing the associated apparatus. The air environment in the unit is not as stringent as in a conventional manufacturing line. Typically, a clean room class 1000 is adequate.

An input and output station 34 is provided to introduce and withdraw semiconductor wafers from the chamber 32. An electroless TiW deposition station, and an electroplating or electroless plating Cu deposition station 38 are provided. These stations are typically plating tanks filled with plating solutions and a handling mechanism to support the wafers. Preferably a pre/metal cleaning tank 40 and a cleaning station are also provided in chamber 32. A primary polishing apparatus 42 is provided, which is shown in more detail in FIG. 3. This apparatus is used to remove the major portion to the Cu layer and uses a conventional pad and slurry. Preferably a secondary polishing apparatus is provided for removing slurry from the surface of substrate 10. This apparatus will normally use only DI water plus a very smooth paste. A slurry/electrolyte supply system 46 is provided within the chamber 32. A suitable automated indexing apparatus 46 capable of moving the substrates to and from the apparatus is provided within chamber 32. An additional transfer apparatus 48 is preferably provided adjacent polishing apparatus 42 and 44, and a water jet cleaning unit.

Figure 2:
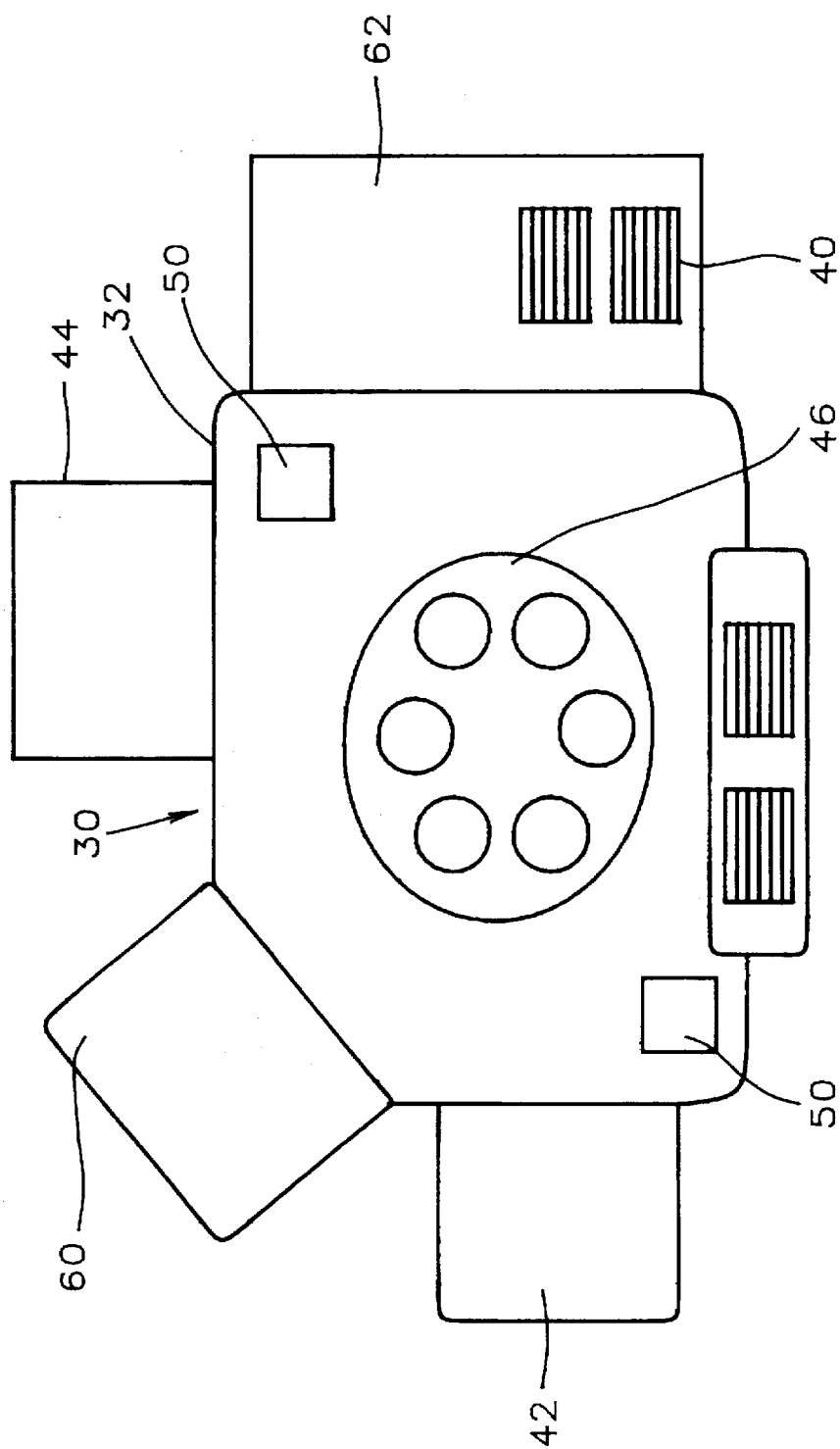
FIG. 2 is a top plan view of a cluster tool apparatus suitable for use in the manufacturing unit of the invention.

A preferred embodiment of the unit 30 is shown in FIG. 2. The unit 30 has a chamber 32, a primary polisher 42, a secondary polisher 44, and an electroplating station 60, provided with electroplating tanks 36 and 38. An unload/load station 34, a water jet cleaning stations 50, a cleaning station 62 containing tanks 40, and an automatic indexer 46 are also included. The apparatus also includes an electroless barrier layer plating device and a barrier etching bath.

Figure 6:
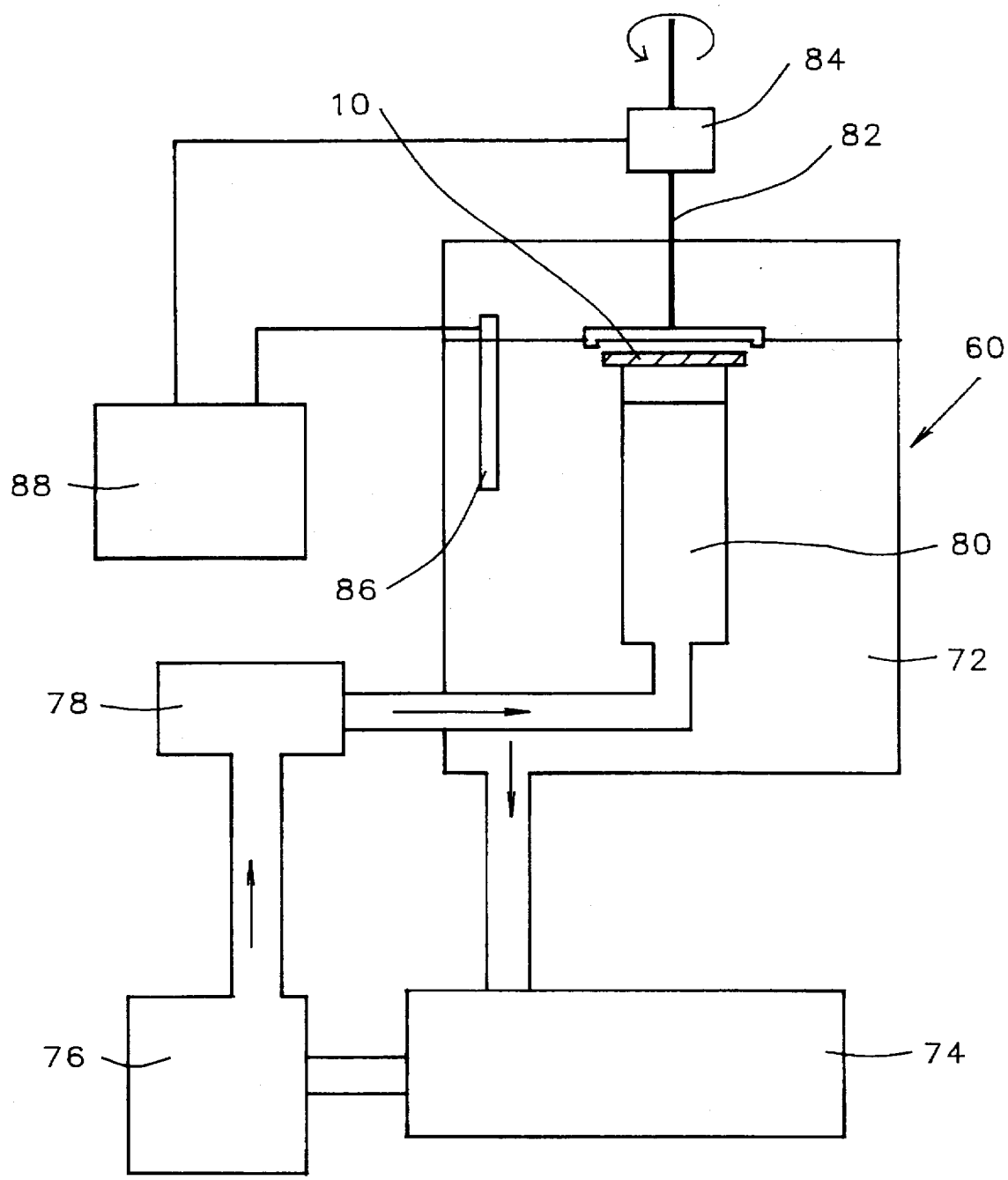
FIG. 6 depicts an electroplating apparatus for depositing Cu.

In FIG. 6 there is depicted an electroplating apparatus 60 for plating Cu on a substrate. The apparatus 60 includes solution tank 72 with a pump 74 to circulate the solution, a heat exchanger 76 to maintain a constant temperature, and a filter 78. An internal baffle 80 directs the solution to the wafer 10 mounted on an electrode 82 above baffle 80. The electrode is rotated by motor 84. A second electrode 86 is mounted in tank 72, and powered by power supply 88.

Alternatively the Cu can be deposited by electroless deposition over the first barrier layer 14 that has been activated. The activation can be done in the very clean environment. The electroless deposition method involves the formation of a thin film of material on the substrate from an electrolytic solution without external applied voltage. The deposition is caused by an electrochemical reaction between the metal ions, reducing agent, complexing agents in the solution, and pH adjusters on a catalytic surface. Electroless metal deposition processes can be divided into two steps: anodic oxidation of reducing agents on catalytic surfaces, and cathodic reduction of metal ions. The role of catalytic materials in electroless deposition processes is to provide catalytic oxidation of reducing agents and to act as a conductive material for transport of electrons from the sites on the surface where anodic reaction occurs to the surface sites for cathodic reduction of metal ions. The electroless deposition of TiW is known and the specifics will not be discussed.

Various modifications can be made in the unit 30 without departing from the spirit and scope of the invention. In general, the processing apparatus in unit 30 relate to wet deposition and planarizing apparatus and the elements that support such apparatus, such as cleaning and etching elements. Substitutions can be made in the apparatus. For example, conventional electro plating apparatus can replace the electroless plating apparatus.

While the invention has been particularly shown and described with reference to the preferred embodiments thereof, it will be understood by those skilled in the art that various changes and modifications may be made without departing from the spirit or scope of the general inventive concept as defined by the appended claims.

What is claimed is:

1. A self contained manufacturing unit for forming Cu interconnect metallurgy on a semiconductor device comprising:

an enclosed chamber;

an input station for introducing semiconductor wafers to be processed into said chamber;

an output station for withdrawing semiconductor wafers that have been processed in said chamber;

a Cu plating apparatus station within said chamber;

a barrier metal electroless plating apparatus station;

a primary polishing apparatus station;

a secondary polishing apparatus station;

an automated indexer apparatus within said chamber for moving wafers to be processed from said input station, through said Cu plating station, said primary polishing station, said secondary polishing station, said barrier metal etch station, to said output station for withdrawal from said chamber for further processing in associated semiconductor manufacturing apparatus that require high clean room environments.

2. The self contained unit of claim 1 which further includes a wafer cleaning station within said chamber, said automated indexer apparatus capable of also delivering wafers to be processed to said wafer cleaning station.

3. The self contained unit of claim 1 wherein said primary polishing apparatus station includes a rotatable platen, a polishing disk on said platen, a means to dispense slurry on said platen, a rotatable carrier above said platen for supporting a wafer to be polished in contact with said polishing disk, said secondary polishing apparatus station including a rotatable platen, a polishing disk on said platen, a rotatable carrier above said platen for supporting a wafer to be cleaned, and a means to dispense water on said platen.

4. The self contained unit of claim 1 wherein said barrier metal layer plating apparatus station is adapted to electrolessly plate the layer, and said Cu plating apparatus station is adapted to electrolessly plate Cu.

5. The self contained unit of claim 1 wherein said barrier metal layer plating apparatus is adapted to electrolessly deposit TiW.

6. A process for forming a Cu interconnect metallurgy on a microminiturized integrated circuit substrate comprising;

forming a first dielectric layer on the top surface of said substrate, in a very clean environment;

depositing, exposing, and developing a mask on said substrate that defines the desired interconnection metallurgy, in a very clean environment;

etching grooves in said first dielectric layer through said mask;

removing said mask;

depositing a thin first layer of a barrier metal;

depositing a thick layer of Cu on the dielectric layer by electro or electroless plating technics, in a less stringent clean environment;

mechanically polishing away the thick Cu layer on the surface of the dielectric layer to expose the surface of the barrier layer, in a less stringent clean environment;

selectively removing the exposed barrier layer, in a less stringent clean environment;

selectively depositing a second thin barrier layer on the surface of the Cu remaining in said grooves, in a less stringent clean environment, forming a second dielectric layer over the first dielectric layer in a very clean environment, and repeating the above steps to form an overlying layer of interconnect metallurgy.

7. The process of claim 6 wherein the thick layer of Cu is deposited by electroplating technics using the barrier layer as a conductive base.

8. The process of claim 6 wherein the barrier layer is activated and the thick layer of Cu is deposited by electroless plating technics.

9. The process of claim 8 wherein the activation of the barrier layer is achieved with Pd.

10. The process of claim 6 wherein the second barrier layer is deposited by electroless plating technics, in a less stringent clean environment.

11. Thee process of claim 6 wherein the grooves are etched in said first dielectric layer using plasma etching technics, in a very clean environment.

12. The process of claim 11 wherein said thin first barrier layer is TiW deposited by chemical vapor deposition technics, in a very clean environment.

13. The process of claim 11 wherein said thin first barrier layer is deposited by sputter deposition technics.

14. The process of claim 7 wherein the masking operation is a two step operation with a first mask to define the via holes, and a second mask to define the interconnection metallurgy pattern.

15. The process of claim 6 wherein the mechanical polishing is a combination of mechanical and chemical polishing.

16. The process of claim 6 wherein the barrier layer is TiW.

17. The process of claim 6 wherein the very clean environment is class 1, and the less stringent clean environment is class 1000.

18. The process of claim 6 wherein the thick Cu layer is mechanically polished to expose the underlying barrier layer, and the barrier layer is selectively etched away to expose the top surface of said first dielectric layer.

19. The process of claim 6 wherein the mask operation is a two step operation with a first mask to define the contact holes, and a second mask to define the interconnection metallurgy pattern.

* * * * *